US007237106B1

(12) United States Patent
Tracy et al.

(10) Patent No.: US 7,237,106 B1
(45) Date of Patent: Jun. 26, 2007

(54) SYSTEM FOR LOADING CONFIGURATION DATA INTO A CONFIGURATION WORD REGISTER BY INDEPENDENTLY LOADING A PLURALITY OF CONFIGURATION BLOCKS THROUGH A PLURALITY OF CONFIGURATION INPUTS

(75) Inventors: Paul Tracy, Sunnyvale, CA (US); Adam Wright, San Jose, CA (US)

(73) Assignee: Altera Corporation, San Jose, CA (US)

( * ) Notice: Subject to any disclaimer, the term of this patent is extended or adjusted under 35 U.S.C. 154(b) by 359 days.

(21) Appl. No.: 10/623,479

(22) Filed: Jul. 18, 2003

(51) Int. Cl.
*G06F 1/24* (2006.01)

(52) U.S. Cl. ............... 713/100; 716/16; 326/37; 326/39; 326/40

(58) Field of Classification Search ............... 713/100; 716/16; 326/37, 39, 40, 38
See application file for complete search history.

(56) References Cited

U.S. PATENT DOCUMENTS 6,091,263 A * 7/2000 New et al. ............... 326/40
6,496,971 B1 * 12/2002 Lesea et al. .............. 716/16
6,507,211 B1 * 1/2003 Schultz et al. ............ 326/37
6,522,167 B1 * 2/2003 Ansari et al. .............. 326/39
6,526,557 B1 * 2/2003 Young et al. .............. 716/16
2003/0122578 A1 * 7/2003 Masui et al. .............. 326/39

* cited by examiner

*Primary Examiner*—Chun Cao
*Assistant Examiner*—Sean Weinman
(74) *Attorney, Agent, or Firm*—Townsend and Townsend and Crew LLP

(57) ABSTRACT

A programmable device with an improved system for loading configuration data compresses configuration data by composing configuration data out of pairs of control words and data words. The configuration data is divided into configuration words. Each configuration word is further divided into a number of configuration blocks. In a control word/data word pair, the control word determines which configuration blocks in the configuration word will be loaded with the data word. Each configuration block designated by the control word will be simultaneously loaded with the data word. By taking advantage of the symmetry within the control word, typically only a small number of control word/data word pairs will be required to load a complete control word. If a given control word does not have sufficient symmetry, the programmable device can instead use an alternate system for loading the configuration word.

22 Claims, 4 Drawing Sheets

SYSTEM FOR LOADING CONFIGURATION DATA INTO A CONFIGURATION WORD REGISTER BY INDEPENDENTLY LOADING A PLURALITY OF CONFIGURATION BLOCKS THROUGH A PLURALITY OF CONFIGURATION INPUTS

BACKGROUND OF THE INVENTION

Programmable devices, such as SRAM-based FPGAs, can be rapidly reconfigured to perform many different functions. Typically, programmable devices include a number of different functional units connected by programmable interconnections. The functions of programmable device are determined by configuration data. Configuration data is loaded into the programmable device and defines the configuration of the functional units and the programmable interconnections. This, in turn, defines the overall functions of the programmable device.

To test programmable devices, test configuration data is loaded into a programmable device to define one or more test functions. The test functions are then tested to ensure that the programmable device is operating properly. Typically, testing a programmable device requires reconfiguration with thousands of different sets of test configuration data to achieve sufficient test coverage. It is desirable to reduce the time, and consequently the cost, of testing for programmable devices.

Loading test configuration data is one of the most time-consuming portions of the test process. Typically, test configuration data must be transferred from a test apparatus into the internal configuration memory of a programmable device. Configuration memory is typically divided into a number of configuration words. Each configuration word defines the configuration of a portion of the programmable device. Typically, a configuration word has far more bits than the number of input pins available for loading configuration data. For example, configuration words may have hundreds or thousands of configuration bits. One prior system for setting the value of each configuration word is to divide each configuration word into a number of configuration blocks. Each configuration block is treated as a large shift register and is assigned to a different input pin. In this system, configuration data is serially loaded into each configuration block. This system can take thousands of clock cycles to load configuration data for a single test, making testing time-consuming and expensive.

Another prior system for loading test configuration data divides the configuration word into a number of configuration blocks. This system loads configuration data into a configuration block in parallel. Each configuration block is simultaneously loaded with identical configuration data. If each configuration block has the same number of bits as there are input pins, then configuration data for an entire configuration word can be loaded in a single clock cycle.

This system's "all or nothing" approach to repeatability leads to problems. If different configuration data needs to be loaded into different blocks, this system cannot be used. This can often occur when configuration data is not symmetrical on a block-wise basis, or when the programmable device architecture is asymmetrical. In these situations, another system for loading configuration data, such as the serial loading system discussed above must be used. Thus, when configuration data violates block-wise symmetry in even a minor way, the system punishes this digression with a maximum load cost. This is especially inefficient because typical configuration data includes a large number of 0's interspersed between a few 1's.

It is desirable to improve the efficiency of loading configuration data into programmable devices with asymmetrical configuration data. It is further desirable to allow for loading of configuration data using one of several alternate systems to maximize the efficiency of the loading process.

BRIEF SUMMARY OF THE INVENTION

The invention, generally, is a method and system for compressing configuration data to decrease the time spent loading configuration data into a programmable device. In an embodiment, the programmable device includes a configuration word register comprising a plurality of configuration blocks, a plurality of configuration inputs selectively coupled with each of the plurality of configuration blocks, and a plurality of command inputs. The command inputs are adapted to independently enable one or more of configuration blocks to simultaneously load configuration data via the plurality of configuration inputs.

In one embodiment, each of the configuration blocks is coupled with one of the plurality of command inputs. Further, at least one configuration block has the same number of bits as there are configuration inputs. In an alternate embodiment, one or more configuration blocks have less bits than the number of configuration inputs.

In another embodiment, the programmable device has a configuration memory with a plurality of memory locations. The configuration memory is coupled with the configuration word register and is adapted to load configuration data from the configuration word register.

In yet a further embodiment, the programmable device includes a configuration mode input and a configuration controller coupled with the configuration mode input. The configuration controller enables the configuration blocks to simultaneously load configuration data via the configuration inputs in response to an enabling by the command inputs in response to a first state of the configuration mode input. In response to a second state of the configuration mode input, the configuration controller enables the loading of configuration data into the configuration word register via an alternate coupling with configuration data.

The alternate coupling with configuration data is via the plurality of configuration inputs, or in another embodiment, via the plurality of command inputs. In a further embodiment, the alternate coupling with configuration data simultaneously loads one bit of configuration data into each of the configuration blocks.

BRIEF DESCRIPTION OF THE DRAWINGS

The invention will be described with reference to the drawings, in which.

DETAILED DESCRIPTION OF THE INVENTION

Figure 1:
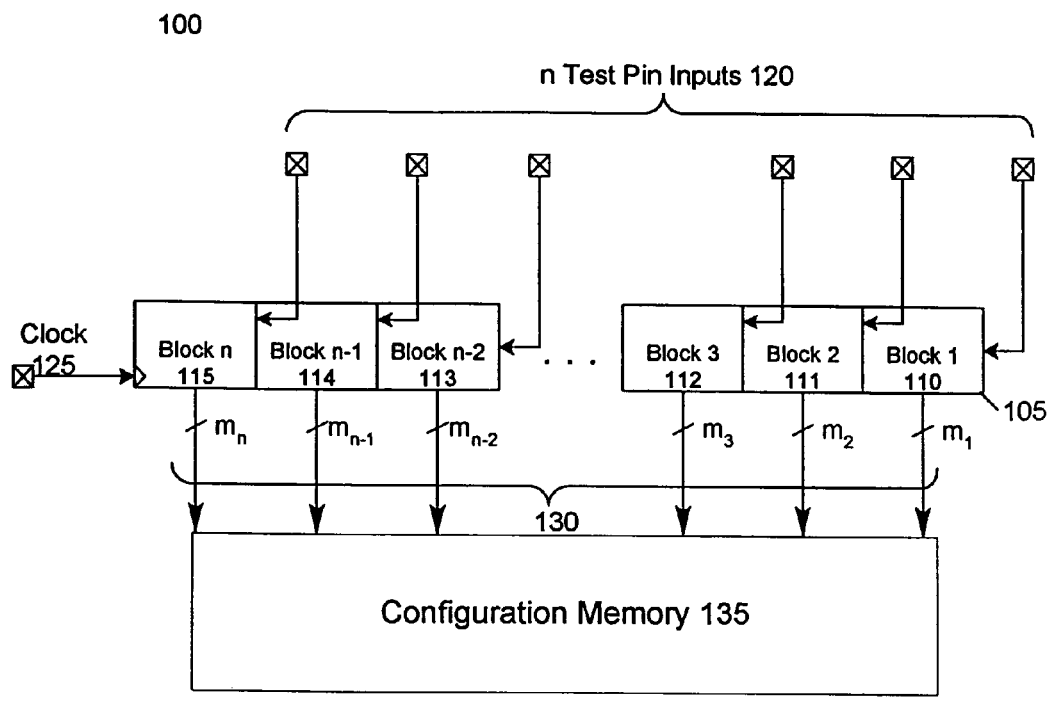
FIG. 1 illustrates a prior system for loading configuration data into a programmable device.

FIG. 1 illustrates a prior system for loading configuration data into a programmable device 100. Programmable device 100 includes a configuration word register 105 adapted to receive configuration data via test pin inputs 120. Configuration word register 105 is comprised of N number of configuration blocks, such as configuration blocks 110, 111, 112, 113, 114, and 115. In programmable device 100, each configuration block is connected with one of the test pin inputs 120. Each configuration block is also connected with clock 125.

Each configuration block has M number of configuration bits. As M is typically greater than 1, programmable device 110 must load configuration data into each configuration block serially via the test pin inputs 120. The highest order, or M, bit of configuration data for each configuration block is placed on the corresponding test pin inputs 120. In response to a signal from clock 125, the M bits of configuration data for each configuration block are loaded into their respective configuration blocks from the test pin inputs 120.

Next, the second-to-highest order, or M−1, bits for each configuration block are similarly placed on their corresponding test pin inputs 120. In response to clock 125, the M−1 bits of configuration data for each configuration block are loaded from the test pin inputs 120 into the appropriate configuration blocks. As this occurs, the M bits previously loaded are shifted one position to the left in the configuration word register 105. This process is repeated for all M bits of each configuration block.

Once all the configuration blocks in configuration word register 105 are loaded with the configuration data, the configuration data is transferred by output connections 130 to configuration memory 135. There may be up to M×N total output connections 130 between the configuration memory 135 and the configuration word register 105. Configuration memory 135 is a memory device, such as a SRAM, for storing the complete set of configuration of the programmable device. Typically, configuration memory includes a number of different configuration words. The configuration data received from the configuration word register 105 is stored in the appropriate location in configuration memory 135. As an example, a programmable device may require hundreds or thousands of configuration words to specify a given configuration.

In programmable device 100, serially loading configuration data into each configuration block and then transferring this data to the configuration memory takes at least M clock cycles. For example, with a 1000 bit configuration word and 50 test pin inputs (i.e. N=50 and M=1000/N=20), each configuration word takes at least 20 clock cycles to load.

Figure 2:
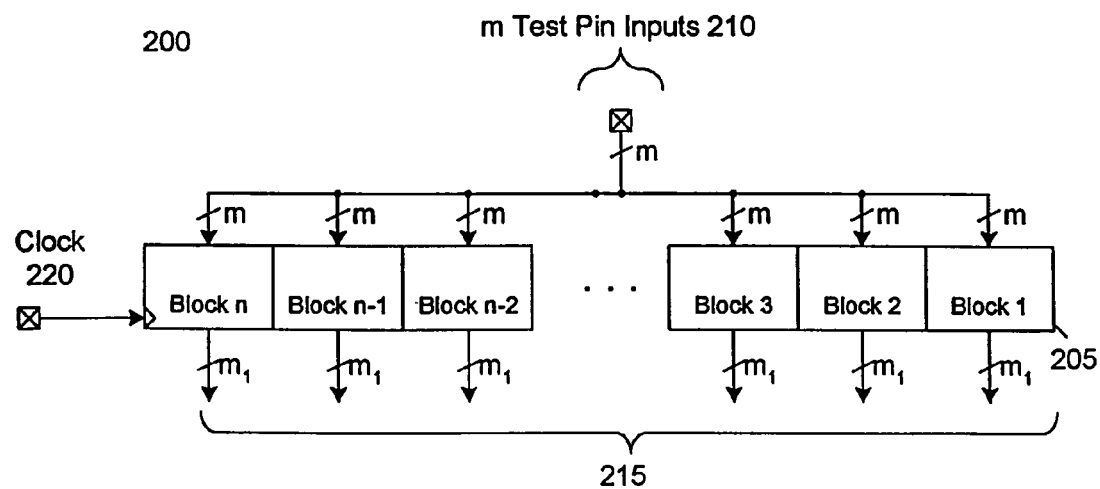
FIG. 2 illustrates another prior system for loading configuration data into a programmable device.

FIG. 2 illustrates another prior system for loading configuration data into programmable device 200 that consumes less time. Programmable device 200 includes a configuration word register 205. Configuration word register 205 is divided into N number of configuration blocks of up to M bits each. There are also M number of test pin inputs 210. Each bit of a configuration block is connected in parallel with the corresponding bits in the other configuration blocks and to one of the M test pin inputs 210.

Programmable device 200 loads configuration data in parallel via the test pin inputs 210. An M number of bits of configuration data are placed on the test pin inputs 210. In response to a signal from clock 220, the M bits of configuration data are loaded into each of the configuration blocks of configuration word register 205. The configuration data loaded into the configuration word register 205 is then transferred to a configuration memory (not shown) via output connections 215, similar to that discussed above.

Programmable device 200 is capable of loading an entire configuration word in a single clock cycle. However, programmable device must load the same configuration data into each of its configuration blocks. Thus, although programmable device 200 is very efficient in loading configuration data with block-wise symmetry, it cannot load all types of configuration data.

Figure 3:
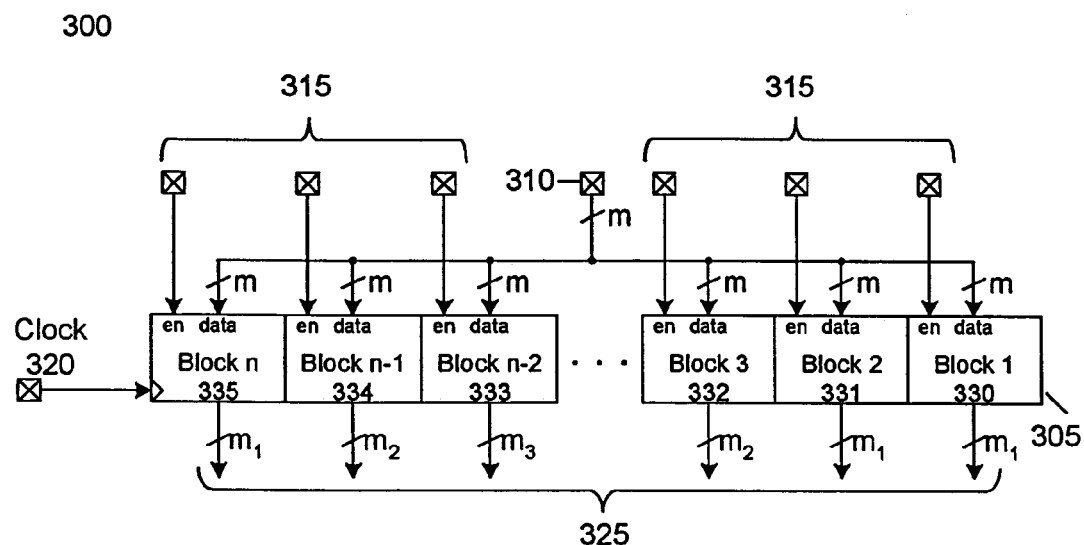
FIG. 3 illustrates a system for loading configuration data into a programmable device according to an embodiment of the invention.

FIG. 3 illustrates a system for loading configuration data into a programmable device 300 according to an embodiment of the invention. Programmable device 300 includes a configuration word register 305. Configuration word register includes an N number of configuration blocks, for example, configuration blocks 330, 331, 332, 333, 334, and 335. N can be any positive whole number and the number of configuration blocks in FIG. 3 should be viewed as an illustrative example and not a limitation.

In an embodiment, each configuration block includes M configuration bits. In an alternate embodiment, configuration blocks can have a different number of configuration bits ranging from 1 to M. This alternate embodiment can be used in programmable devices where the total number of bits, T, in configuration word register 305 is not evenly divisible by M. In an example, there can be N−1 number of configuration blocks with M bits each and one configuration block with T modulo M bits. Other ways of allocating configuration bits between configuration blocks are also possible in this alternate embodiment.

Each bit of each configuration block is connected with one of the set of M number of test pin inputs 310, such that M bits of configuration data can be loaded into each configuration block in parallel. If a configuration block has less than M bits, then some of the test pin inputs will not be connected with that configuration block; however, each configuration block will be connected with at least one test pin input.

The configuration blocks are connected with clock 320. Each configuration block in configuration word register 305 is also separately connected with one of a set of block enable lines 315. If there are N configuration blocks, there will be N block enable lines in the set of block enable lines 315. When a block enable line is asserted while a clock signal is received, the corresponding configuration block will load up to M bits of configuration data from the set of test pin inputs 310.

In an embodiment, programmable device 300 receives configuration data in the form of pairs of command words and data words. Each data word includes up to M bits of configuration data. Each command word indicates one or more configuration blocks that will load the configuration data from the data word. In a further embodiment, each command word has N bits. Each bit of the command word corresponds to one of the block enable lines associated with one of the configuration blocks. If a bit of a command word is a "1", the corresponding block enable line is to be asserted and the configuration block will load up to M bits of configuration data via test pin inputs 310. Conversely, if a bit of a command word is a "0", the corresponding block enable line will not be asserted and the configuration block will ignore the configuration data from test pin inputs 310. If a configuration block has less than M bits, then the configuration block will ignore the excess number of bits from test pin inputs 310.

An example loading operation of programmable device 300 begins by placing the bits of the command word on the corresponding lines of the set of block enable lines 315. The bits of the data word are placed on the test pin inputs 310. Upon receiving a signal from clock 320, up to M bits of configuration data are simultaneously loaded into the configuration blocks having asserted block enable lines. The number of configuration blocks simultaneously loaded with configuration data can be any number from one up to N. The loading operation can be repeated numerous times with different command and data words until all of the configuration data for a given configuration word has been loaded into the configuration word register 305. In an embodiment, the complete configuration word is then transferred to a configuration memory (not shown) via output connections 325. This loading operation can then be started again for the next configuration word, until the configuration of the programmable device 300 is complete.

If the configuration blocks in configuration word register 305 is aligned with the symmetry in command words, the programmable device 300 will be able to load many configuration blocks with identical configuration data. This results in a substantial decrease in configuration time. Moreover, programmable device 300 can maximize the use of symmetry in a configuration word by simultaneously loading as many configuration blocks as possible with successive blocks of configuration data until the configuration word register is completely filled. Additionally, programmable device 300 can load asymmetrical configuration data by only asserting one block enable line at a time.

In some cases, if the configuration data in a configuration word is very asymmetrical, it may be more efficient to load configuration data serially, as discussed above with reference to FIG. 1. For example, if N, the number of configuration blocks, is greater than M, the maximum number of bits in a single configuration block, and there are more than M different blocks of configuration data in a configuration word, then it is more efficient to load the configuration word serially. In a further embodiment of the invention, a programmable device can alternate between the loading system discussed with reference to FIG. 3 and an alternate loading system, such as that discussed with reference to FIG. 1.

Figure 4:
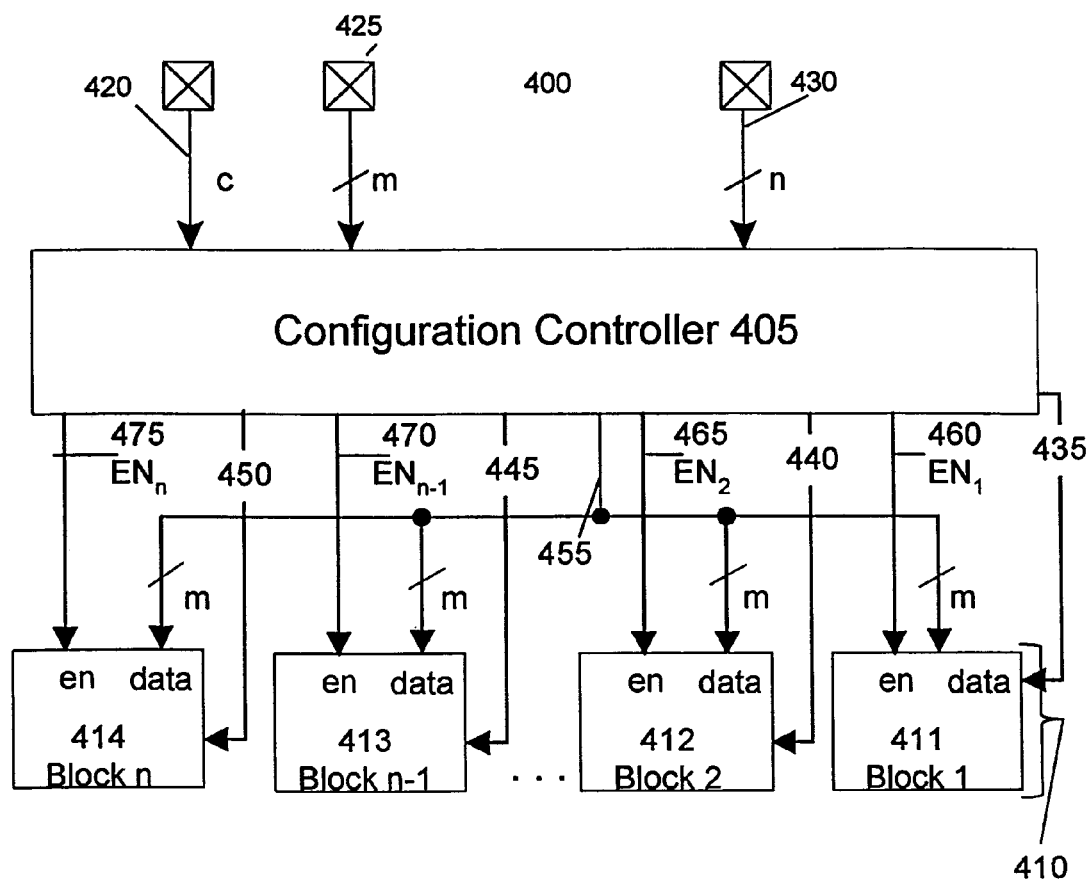
FIG. 4 illustrates a system for loading configuration data into a programmable device according to another embodiment of the invention.

FIG. 4 illustrates a system for loading configuration data into programmable device 400 according to this further embodiment of the invention. Programmable device 400 includes a configuration word register 410. Configuration word register includes an N number of configuration blocks, for example, configuration blocks 411, 412, 413, and 414. N can be any positive whole number and the number of configuration blocks in FIG. 4 should be viewed as an illustrative example and not a limitation.

In an embodiment, each configuration block includes M configuration bits. Similar to that discussed above, an alternate embodiment of configuration word register 410 can have configuration blocks with differing numbers of configuration bits ranging from 1 to M. Each bit of each configuration block is connected with one of the set of M number of test pin inputs 455, such that M bits of configuration data can be loaded into each configuration block in parallel, similar to that described above.

Each configuration block in configuration word register 410 is also separately connected with one of a set of block enable lines, such as block enable lines 460, 465, 470, and 475. If there are N configuration blocks, there will be N block enable lines in the set of block enable lines. When a block enable line is asserted while a clock signal is received via a clock (not shown), the corresponding configuration block will load up to M bits of configuration data from the set of test pin inputs 455.

Each configuration block is also connected with one of a set of serial test pin inputs, such as serial test pin inputs 435, 440, 445, and 450. Each serial test pin input loads one bit at a time into its associated configuration block. As discussed above, as each new configuration bit is loaded into a configuration block, the previously loaded bits are shifted to the next bit position (for example, bits can be shifted left or right).

A configuration controller 405 determines whether configuration data should be loaded serially or in parallel. Configuration controller 405 is connected with mode pin 420, a set of M data inputs 425, and a set of N command inputs 430. In an embodiment, when mode pin is asserted, configuration controller 405 connects data inputs 425 with test pin inputs 455 and each of the set command inputs 430 with a corresponding one of the block enable lines. In this manner, each configuration block with an asserted enable line will load configuration data from test pin inputs 455. This process is repeated for each different block of configuration data in a configuration word.

Conversely, when mode pin 420 is not asserted, configuration controller 405 connects each of the set of command inputs 425 with a corresponding one of the serial test pin inputs. In this manner, each configuration block can simultaneously load 1 bit of configuration data. This process is repeated for a total M times to load a complete configuration word. In this embodiment, the N command inputs 430 are used to load configuration data for serial data transfer, while the M data inputs 425 are used to load configuration data in parallel. This is done because there is N number of serial test pin inputs.

It should be noted that a programmable device can select either of the two loading systems for each configuration word in a programmable device's configuration to maximize the efficiency of the configuration process. In an embodiment, a test apparatus or other configuration device evaluates each configuration word before it is to be loaded into a configuration device to determine the optimal loading system. In a further embodiment, the parallel loading system is used when a configuration word has more than M number of unique block patterns of configuration data. Otherwise, the serially loading system, which takes M number of cycles to load a configuration word regardless of its content, is used.

In another embodiment of system 400, both the N command inputs 430 and the M data inputs 425 are used to together to load configuration data for serial data transfer. In this embodiment, the configuration blocks are different sizes depending on whether the parallel data transfer system or the serial data transfer system is used. During parallel data transfer, there are N configuration blocks of M bits each. For serial data transfer, there are M+N configuration blocks of T/(M+N) bits each, where T is the total number of bits in configuration word register 410. There are also M+N serial test pin inputs associated with the M+N configuration blocks.

The configuration controller 405 connects the N command inputs 430 with the block enable lines during parallel loading, as described above, and with N of the M+N serial test pin inputs during serial loading. Similarly, the configuration controller 405 connects the M data inputs 425 with test pin inputs 455 during parallel loading, as described above, and with M of the M+N serial test pin inputs during serial loading. In this embodiment, serial loading of a configuration word takes T/(M+N) clock cycles. When there are less than T/(M+N) different M-sized blocks of configuration data in a configuration word, the parallel loading system is used; otherwise, the serial loading system is more efficient.

This invention allows for greatly reduced configuration times, which is particularly advantageous when testing programmable devices by loading a large number of different configurations. Because of the decreased time, and consequently cost, of testing, it allows for more asymmetrical designs, which often are better for design routing purposes, to be used. Although the invention has been discussed with respect to specific examples and embodiments thereof, these are merely illustrative, and not restrictive, of the invention. For instance, the embodiment of FIG. 4 is adaptable to other loading systems besides that described with reference to FIG. 1. Thus, the scope of the invention is to be determined solely by the claims.

What is claimed is:

1. A system for loading configuration data into a programmable device, the system comprising:
    a configuration word register comprising a plurality of configuration blocks;
    a plurality of configuration inputs coupled with each of the plurality of configuration blocks and adapted to communicate configuration data; and
    a plurality of command inputs adapted to independently enable loading of at least one of the plurality of configuration blocks, wherein the plurality of configuration blocks are adapted to simultaneously load configuration data via the plurality of configuration inputs in response to the plurality of command inputs.

2. The system of claim 1, wherein each of the plurality of configuration blocks is coupled with one of the plurality of command inputs.

3. The system of claim 1, wherein at least one configuration block comprises a plurality of bits equal in number to the number of configuration inputs.

4. The system of claim 3, wherein at least one configuration block comprises one or more bits, such that the total number of bits is less than the number of configuration inputs.

5. The system of claim 1, further comprising:
    a configuration memory having a plurality of memory locations and coupled with the configuration word register, wherein the configuration memory is adapted to load configuration data from the configuration word register.

6. The system of claim 1, further comprising:
    a configuration mode input; and
    a configuration controller coupled with the configuration mode input, wherein, in response to a first state of the configuration mode input, the configuration controller is adapted to enable the plurality of configuration blocks to simultaneously load configuration data via the plurality of configuration inputs in response to the plurality of command inputs, and, in response to a second state of the configuration mode input, the configuration controller is adapted to enable loading of configuration data into the configuration word register via an alternate coupling with configuration data.

7. The system of claim 6, wherein the alternate coupling with configuration data is via the plurality of configuration inputs.

8. The system of claim 6, wherein the alternate coupling with configuration data is via the plurality of command inputs.

9. The system of claim 6, wherein the alternate coupling with configuration data is adapted to simultaneously load a one bit of configuration data into each of the configuration blocks.

10. A method for loading configuration data for a configuration word comprised of a plurality of configuration blocks into a programmable device, the method comprising:
    receiving a command word via a plurality of command inputs designating a first subset of the plurality of configuration blocks;
    receiving a data word comprising a portion of the configuration data for configuration word via a plurality of configuration inputs; and
    simultaneously loading the data word into each one of the subset of configuration blocks designated by the command word
    wherein the steps of receiving the command word, receiving the data word, and loading the data word are repeated for a second data word and a second command word designating a second subset of the plurality of configuration blocks and wherein the second subset of the plurality of configuration blocks does not intersect the first subset of the plurality of configuration blocks.

11. The method of claim 10, wherein the command word comprises a plurality of command bits, such that each command bit is associated with one of the plurality of configuration blocks.

12. The method of claim 10, wherein at least one configuration block in the first subset of the plurality of configuration blocks comprises a plurality of bits equal in number to the number of configuration inputs.

13. The method of claim 10, further comprising:
    loading configuration data from the plurality of configuration blocks into a memory location in a configuration memory.

14. The method of claim 10, further comprising:
    receiving a configuration mode via a configuration mode input;
    enabling the first subset of the plurality of configuration blocks to simultaneously load configuration data via the plurality of configuration inputs in response to a first state of the configuration mode; and
    loading configuration data into the plurality of configuration blocks via an alternate communication means in response to a second state of the configuration mode.

15. The method of claim 14, wherein the alternate communication means is via the plurality of configuration inputs.

16. The method of claim 14, wherein the alternate communication means is via the plurality of command inputs.

17. The method of claim 14, wherein loading configuration data into the plurality of configuration blocks comprises:
    simultaneously loading one bit of configuration data into each of the plurality of configuration blocks.

18. The method of claim 10, further comprising:
    testing the programmable device loaded with the configuration data.

19. The method of claim 18, further comprising:
    repeating with a second set of configuration data the steps of receiving a third command word, receiving a third data word, loading the third data word, and testing in order to test the programmable device loaded with the second set of configuration data.

20. A system having a plurality of devices, the system comprising:
a programmable device including:
a configuration word register comprising a plurality of configuration blocks,
a plurality of configuration inputs coupled with each of the plurality of configuration blocks and adapted to communicate configuration data, and
a plurality of command inputs adapted to independently enable at least one of the plurality of configuration blocks, wherein the plurality of configuration blocks are adapted to simultaneously load configuration data via the plurality of configuration inputs in response to the plurality of command inputs; and
an interface for connecting the programmable device with a configuration data source.

21. The system of claim 19, further including:
a configuration source having a set of configuration data and adapted to communicate the set of configuration data with the programmable device.

22. The system of claim 21, wherein the configuration source includes a plurality of different sets of configuration data and is adapted to test the programmable device by successively communicating each of the plurality of different sets of configuration data with the programmable device.

* * * * *